United States Patent
Larsson et al.

(10) Patent No.: US 6,822,495 B2
(45) Date of Patent: Nov. 23, 2004

(54) SYSTEM AND METHOD FOR IMPLEMENTING A SKEW-TOLERANT TRUE-SINGLE-PHASE-CLOCKING FLIP-FLOP

(75) Inventors: Alf Larsson, Bjärred (SE); Lars Svensson, Göteborg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 534 days.

(21) Appl. No.: 09/306,684

(22) Filed: May 6, 1999

(65) Prior Publication Data

US 2003/0210085 A1 Nov. 13, 2003

(51) Int. Cl.[7] .............................................. H03K 3/356
(52) U.S. Cl. ...................... 327/211; 327/200; 327/213; 327/218
(58) Field of Search ................................. 327/199, 200, 327/210, 211, 212, 213, 218, 166, 176

(56) References Cited

U.S. PATENT DOCUMENTS

| | | | |
|---|---|---|---|
| 4,745,302 A | * 5/1988 | Hanawa et al. | 327/218 |
| 5,259,006 A | 11/1993 | Price et al. | 375/107 |
| 5,321,368 A | * 6/1994 | Hoelzle | 328/63 |
| 5,465,347 A | 11/1995 | Chao et al. | 395/550 |
| 5,519,340 A | 5/1996 | Rybicki et al. | 326/88 |
| 5,682,115 A | 10/1997 | Merritt | 327/306 |
| 5,793,228 A | 8/1998 | Evans | 326/98 |
| 5,841,304 A | 11/1998 | Tam | 327/161 |
| 5,898,640 A | * 4/1999 | Ben-Meir et al. | 327/218 |
| 6,064,246 A | * 5/2000 | Endo et al. | 327/218 |

FOREIGN PATENT DOCUMENTS

| | | |
|---|---|---|
| JP | 63 237611 | 10/1988 |
| JP | 09 034586 | 2/1997 |
| JP | 09 134227 | 5/1997 |

OTHER PUBLICATIONS

Patrik Larsson; *Skew Safety and Logic Flexibility in a True Single Phase Clocked System*; 1995 IEEE International Symposium on Circuits and Systems, Seattle; Apr. 30, 1995; pp. 941–944.

Robert Rogenmoser and Qiuting Huang; *An 800 MHz 1–Micron CMOS Pipelines 8–Bit Adder Using True Single–Phase Logic–Flip–Flops*; IEEE 1995 Custom Integrated Circuits Conference; May 1, 1995; pp. 581–584.

Jiren Yuan and Christer Svensson; *High–Speed CMOS Circuit Technique*; IEEE Journal of Solid–State Circuits, vol. 24, No. 1; Feb. 1989; pp. 62–70.

Qiuting Huang and Robert Rogenmoser; *Speed Optimization of Edge–Triggered CMOS Circuits for Gigahertz Single–Phase Clocks*; IEEE Journal of Solid–State Circuits, vol. 31, No. 3; Mar. 1996; pp. 456–465.

(List continued on next page.)

*Primary Examiner*—Timothy P. Callahan
*Assistant Examiner*—An T. Luu
(74) *Attorney, Agent, or Firm*—Jenkins & Gilchrist, P.C.

(57) ABSTRACT

An exemplary skew-tolerant true-single-phase-clocking (TSPC) flip-flop is disclosed that reduces current spikes by allowing willful introduction of skew in the clock tree of a single-phase circuit design. More precisely, a split-clock TSPC flip-flop, which allows the flip-flop hold times to be met in the face of skewed clocks, which, in turn, reduces the maximum value of current spikes, can be substituted for a traditional TSPC flip-flop in a sequential logic circuit. The input of the split-clock TSPC flip-flop is latched according to a first clock signal, which was used in a preceding stage, while the output of the split-clock TSPC flip-flop is driven according to a second clock signal. The first and second clock signals can be skewed in time, but have the same frequency and substantially the same phase. Metal Oxide Semiconductor (MOS) device can also be included within the split-clock TSPC flip-flop to reduce power dissipation in cases of large clock skew.

9 Claims, 4 Drawing Sheets

OTHER PUBLICATIONS

Nelson F. Goncalves and Hugo J. DeMan; *NORA: A Race-free Dynamic CMOS Technique for Pipelined Logic Structures*; IEEE Journal of Solid–State Circuits, vol. SC–18, No. 3; Jun. 1983; pp. 261–266.

Takayasu Sakurai and A. Richard Newton; *Delay Analysis of Series–Connected MOSFET Circuits*; IEEE Journal of Solid–State Circuits, vol. 26, No. 2; Feb. 1991; pp. 122–131.

* cited by examiner

SYSTEM AND METHOD FOR IMPLEMENTING A SKEW-TOLERANT TRUE-SINGLE-PHASE-CLOCKING FLIP-FLOP

BACKGROUND OF THE PRESENT INVENTION

1. Field of the Invention

The present invention relates generally to systems and methods for designing synchronous digital circuits, and specifically to designing a skew-tolerant true-single-phase clocking flip-flop.

2. Background and Objects of the Present Invention

Clock signals are used in synchronous digital circuits to allow different parts of the circuit to communicate with each other without data loss. Values carried by data signals are defined at specific times relative to the transitions of the clock signals, and are read into and out of storage elements at times related to these same transitions. The clock signals are typically distributed to all storage elements in the design. The inevitable signal delay caused by the distribution network must be taken into account during its design, such that the clock signal arrives at all storage elements at substantially the same time.

The required degree of simultaneity may be quantified with the setup time and hold time for the clocked devices, such as flip-flops. In order to meet the required setup time for a flip-flop device, input data must be present at the data input lead of the flip-flop device and in stable form for a predetermined amount of time before the clock transition. In order to meet the hold time requirement for the flip-flop device, the data must be stable from the time of the clock transition on arrival at the control lead of the flip-flop up to a certain time interval after the arrival of the clock.

Many setup time violations may be remedied simply by slowing down the frequency at which the design is clocked. However, hold time violations may be caused by clock skew, and can persist regardless of the clock frequency. Insufficient control of the clock delay in different parts of the clock distribution network may cause the clock edges to arrive at the clocked devices at different times. These time differences constitute the clock skew, which, if large enough to cause hold violations (or setup violations if the clock frequency is high enough), can cause circuit malfunction. For example, the clock skew may cause data in a first register to shift earlier than data on a second register. The hold time requirement of the second register may, therefore, be violated, and data bits may then be lost.

A dominant clocking strategy presently used for digital circuits is single-phase clocking with true-single-phase-clocking (TSPC) flip-flops. Single-phase clocking systems use only one clock signal, and therefore, only one clock distribution network, which avoids the task of controlling clock skew among several networks. The only clock skew present in a single-phase-clocking system is that created among several instances of the same signal which have suffered different amounts of delay through different paths in the distribution network. Therefore, the simplified clock skew management task in single-phase-clocking systems allows for high clock frequencies compared with previously utilized clocking techniques. These benefits often outweigh the drawbacks, one of which is a stringent requirement on the clock transition speed.

Current schemes for distributing clock signals to storage elements concentrate on ensuring synchronicity of all clock signals. Clocks are typically distributed in a tree-like structure, whereby delays in different branches can be balanced to a high degree. The highly balanced clock trees traditionally used with single-phase clocking cause all TSPC flip-flops in the design to toggle virtually simultaneously. The capacitive loads driven by the flip-flop outputs are then charged simultaneously, drawing a large current spike from the supply.

Such current spikes are undesirable due to the resulting metal migration in supply wires. The rate of migration depends strongly upon the maximum current density that occurs in the wire. Large current spikes thus require wider supply wires with the concomitant cost in area. In addition, large current spikes feature large values of dI/dt. Together with the parasitic inductance present in the IC package, the current spikes thus cause voltage fluctuations on the supply lines. These fluctuations can cause both malfunction of the digital circuits and reduced performance level of co-located analog circuity. Although the aforementioned problems may be corrected by advanced packaging and on-chip decoupling capacitance, both of these methods increase the cost of the device. Furthermore, the large current spikes themselves can couple inductively into other parts of the design and cause malfunction or performance reduction. The aforementioned electrical problems can potentially be alleviated by introducing a controlled amount of clock skew, such that not all storage elements change value at the same time. However, such purposefully added skew could create logical malfunctions due to hold violations, as described above.

It is, therefore, an object of the present invention to provide a skew-tolerant TSPC flip-flop that reduces the overall current spike.

SUMMARY OF THE INVENTION

A preferred embodiment of the present invention is directed to a skew-tolerant TSPC flip-flop that reduces the overall current spike by allowing willful introduction of skew in the clock tree of a single-phase design. More precisely, a split-clock TSPC flip-flop, which allows the flip-flop hold times to be met even with skewed clocks, can be substituted for a traditional TSPC flip-flop in a sequential logic circuit. By introducing clock skew, different flip-flops toggle at slightly different times, such that the corresponding current spikes are slightly staggered in time. Therefore, the clock skew can serve to "smear out" the overall current spike, which reduces the maximum value of the current spike as well as the maximum value of dI/dt. The input of the split-clock TSPC flip-flop can be latched according to a first clock signal, which was used in a preceding stage, while the output of the split-clock TSPC flip-flop can be driven according to a second clock signal. The first and second clock signals are skewed in time, but have the same frequency and substantially the same phase. In one embodiment, an additional Metal Oxide Semiconductor (MOS) device can be included within the split-clock TSPC flip-flop to reduce power dissipation in cases of large clock skew.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE PRESENTLY PREFERRED EXEMPLARY EMBODIMENTS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
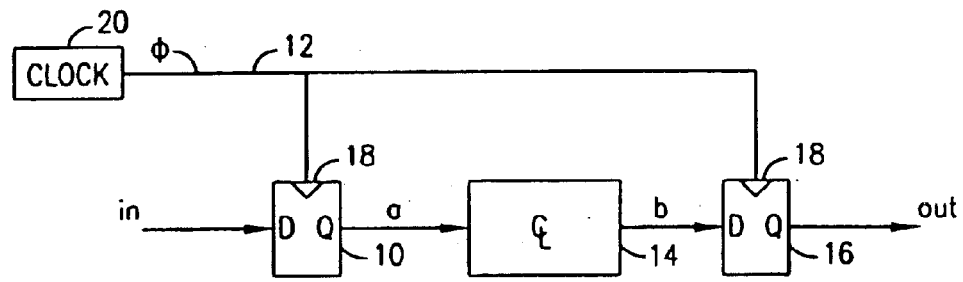
FIG. 1 is a schematic diagram of one pipeline stage in a digital sequential logic circuit.

With reference now to FIG. 1 of the drawings, a sequential logic circuit is shown having a first D type flip-flop (D-FF) 10, which has a data input D for receiving an input signal "in," a clock input 18 for receiving a clock signal Φ and a data output Q for transmitting an output signal "out." Data is clocked into the D-FF 10 in accordance with well-known methods on the rising or falling edge of a clock signal Φ generated by a clock 20 along a line 12 leading to the clock input 18. Data propagates through combinational logic 14 connected to the D-FF 10 over line "a" in accordance with conventional methods, and the output of the combinational logic 14 is clocked into a second D-FF 16 over line "b."

Figure 2:
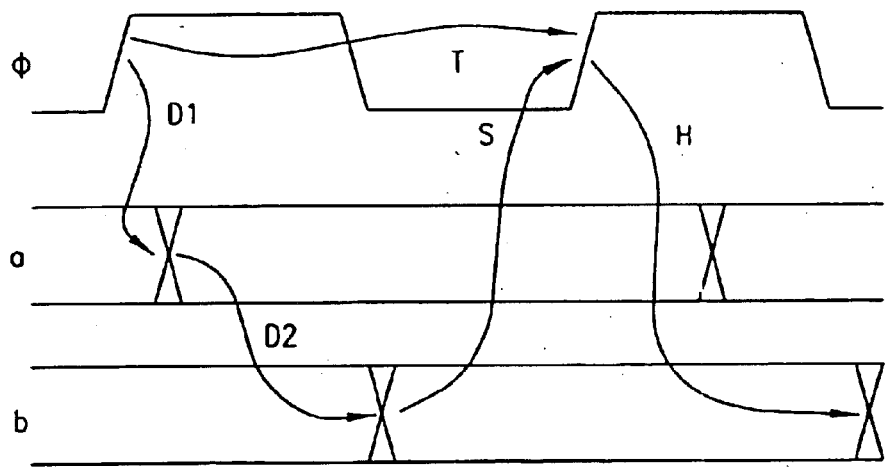
FIG. 2 is a timing diagram illustrating proper setup and hold times associated with the circuit shown in FIG. 1 of the drawings.

The timing diagram of FIG. 2 shows that in order for the circuit of FIG. 1 to operate properly, data must be stable on the input D of the D-FF 16 relative to the arrival of the clock signal Φ at the clock input 18 for a specified period of time. As shown in FIG. 2, for any clocked device, there is a specified "setup time" S and a specified "hold time" H. Input data must be present and stable from at least the setup time S before the clock transition until a period equal to at least the hold time H after the clock transition, for proper operation.

For example, in FIG. 2, D1 is the intrinsic delay in the first D-FF 10, while D2 is the delay through the combinational logic 14. It should be noted that D2 can take on a range of values depending upon the function performed by the combinational logic 14. In addition, S, H, and D1 are data-dependent, but can be considered constant in FIG. 2. In order to prevent a setup violation, it is required that the clock period T satisfy the following equation:

$$T > D1 + \max(D2) + S \qquad (1)$$

The maximum delay of the combinational logic 14 typically dominates D1 and S. In addition, in order to prevent a hold violation, the hold time H must satisfy the following equation:

$$H < D1 + \min(D2) \qquad (2)$$

As min(D2) can be very small, it is frequently more difficult to guarantee the hold condition than the setup condition, especially when T is not very small.

Figure 3:
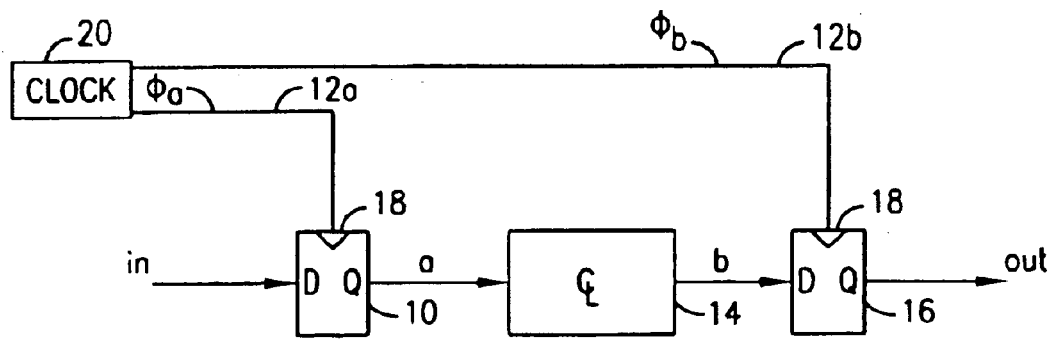
FIG. 3 is a schematic diagram of one pipeline stage in a digital sequential logic circuit with skewed clocks.
Figure 4:
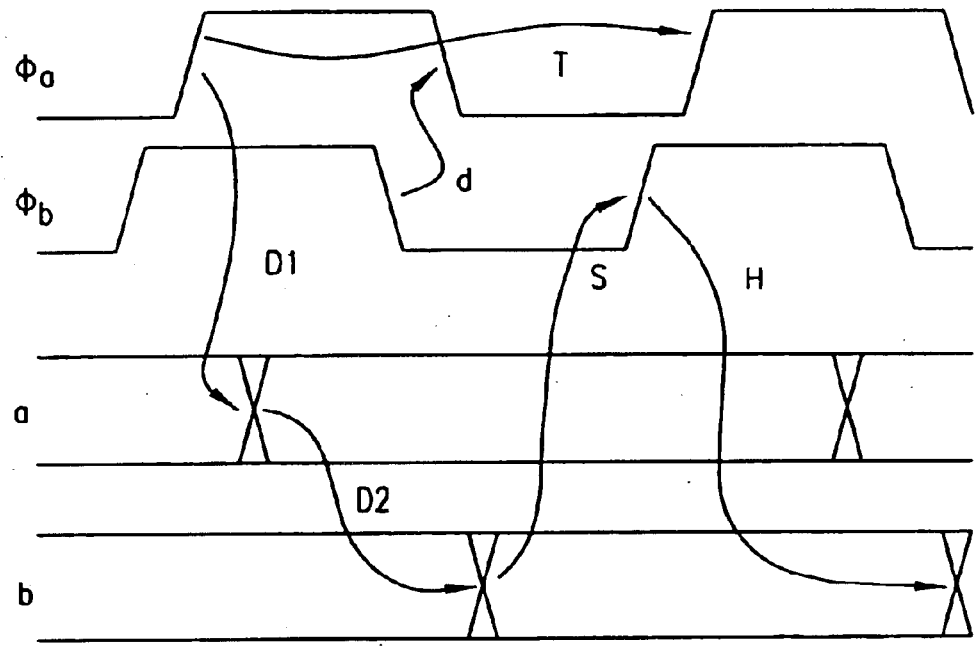
FIG. 4 is a timing diagram illustrating proper setup and hold times associated with the circuit shown in FIG. 3 of the drawings.

With reference now to FIG. 3 of the drawings, the same circuit as in FIG. 1 is shown, but with skewed clocks $\Phi_a$ and $\Phi_b$ being transmitted over lines 12a and 12b, respectively. As shown in the timing diagram of FIG. 4, which corresponds with the circuit shown in FIG. 3, if the clock skew "d" is positive, the setup requirement becomes more difficult to satisfy and the hold requirement becomes easier to satisfy. However, the opposite holds true if d is negative. For example, the setup requirement is now:

$$T - d > D1 + \max(D2) + S. \qquad (3)$$

This setup requirement is stricter if d is positive. However, since max(D2) is likely to be much larger than d, it is still possible to meet the requirement by adjusting max(D2) by modifying the implementation of the combinational logic block. In addition, the hold requirement is now:

$$H < D1 + \min(D2) + d. \qquad (4)$$

This hold requirement is stricter if d is negative. Furthermore, if the magnitude of d is sufficiently large, it will be virtually impossible to meet the hold requirement. The clock skew can usually be held low enough in conventional single-phase logic design, but the amount of extra clock skew which can be introduced to address the problem of current spike is necessarily limited.

Therefore, in accordance with aspects of the present invention, in order to reduce the current spike seen in typical single-phase circuit designs, clock skew is purposefully introduced without causing a hold violation by utilizing a modified true-single-phase-clocking (TSPC) flip-flop as the second D-FF 16. The introduction of clock skew causes different flip-flops 10 and 16 to toggle at slightly different times, such that the corresponding current spikes are slightly staggered in time. The clock skew can therefore serve to "smear out" the overall current spike, reducing its maximum value as well as the maximum value of dI/dt. Furthermore, this willful introduction of clock skew does not prevent the second D-FF 16 hold time from being met.

Figure 5:
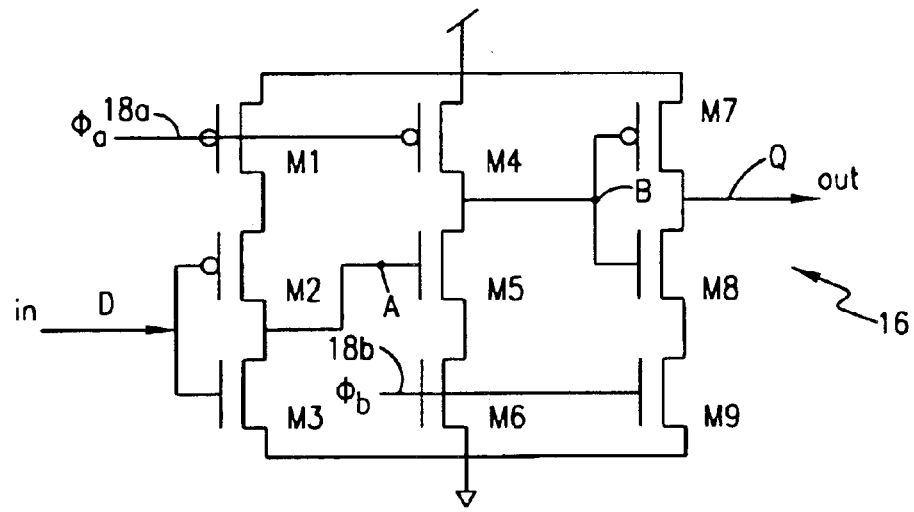
FIG. 5 illustrates a split-clock, skew-tolerant true-single-phase-clocking (TSPC) flip-flop in accordance with embodiments of the present invention.

Thus, with reference now to FIG. 5 of the drawings, in accordance with embodiments of the present invention, one type of a nine-transistor M1–M9 split-clock TSPC flip-flop 16 is shown, which can be substituted for the second D-FF 16 shown in FIGS. 1 and 3 of the drawings. In operation, at the rising edge of the first clock signal $\Phi_a$ of the split clock TSPC flip-flop 16, the input signal "in" at the input D is isolated from the rest of the circuit 16 as two p-type field effect transistors (pFETs) M1 and M4 turn off. Node B cannot be pulled up since M4 is off, and node A cannot be charged up since M1 is off. Therefore, node B cannot be discharged as a consequence of a falling input.

At the rising edge of the second clock signal $\Phi_b$, which has the same frequency and substantially the same phase as the first clock signal $\Phi_a$, but is preferably slightly skewed in arrival time from the first clock signal $\Phi_a$, the previous data stored in the flip-flop 16 is driven to the output Q. This is accomplished by n-type field effect transistors (nFETs) M9 and M6 turning on, which allows the output Q to go low if node B is high, and alternatively allows node B to go low and the output Q to go high if node A is high. Therefore, at the rising edge of the first clock $\Phi_a$, the pFETs M1 and M4 isolate the input signal "in," while at the rising edge of the second clock $\Phi_b$, the nFETs M9 and M6 drive the stored data to the output Q to be transmitted by the flip-flop 16 as output signal "out." By having the pFETs M1 and M4 and the nFETs M6 and M9 controlled by two separate clock signals $\Phi_a$ and $\Phi_b$, respectively, which are slightly skewed, the overall current spike is reduced without violating TSPC flip-flop 16 hold times.

The use of separate clocks $\Phi_a$ and $\Phi_b$ for input and output control, respectively, does not correspond to the two-phase clock designs that predated the single-phase paradigm. Two-phase logic styles with good skew tolerance have been described, for example, in the following article by N. F. Goncalves and H. De Man: NORA: A Racefree Dynamic CMOS Technique for Pipelined Logic Structures; *IEEE JSSC*, Vol. SC-18, No. 3, pp. 261–66; June 1983. However, the two-phase clock designs described in the Goncalves article were not designed to handle the case when the two clock phases were identical or nearly identical. In contrast, the split clock flip-flop 16 described herein handles both small positive and negative skews, as well as "zero" skew.

Figure 6:
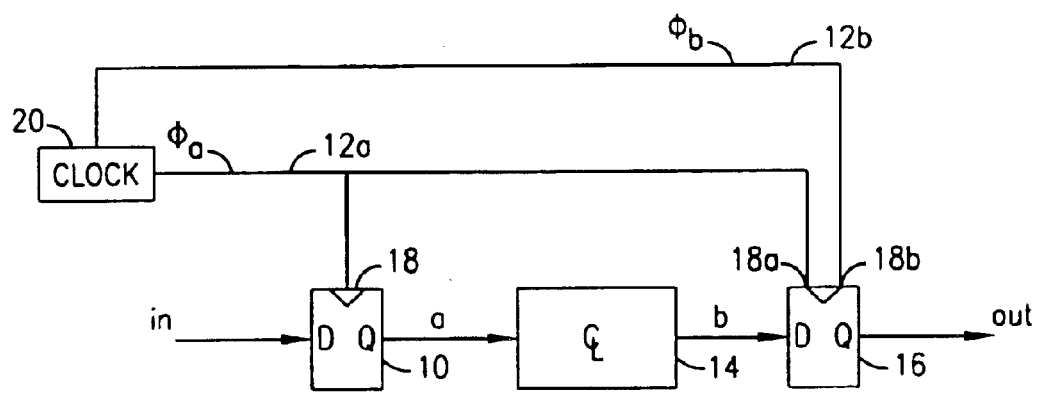
FIG. 6 is a schematic diagram of one pipeline stage in a digital sequential logic circuit with a split-clock TSPC flip-flop in accordance with embodiments of the present invention.
Figure 7:
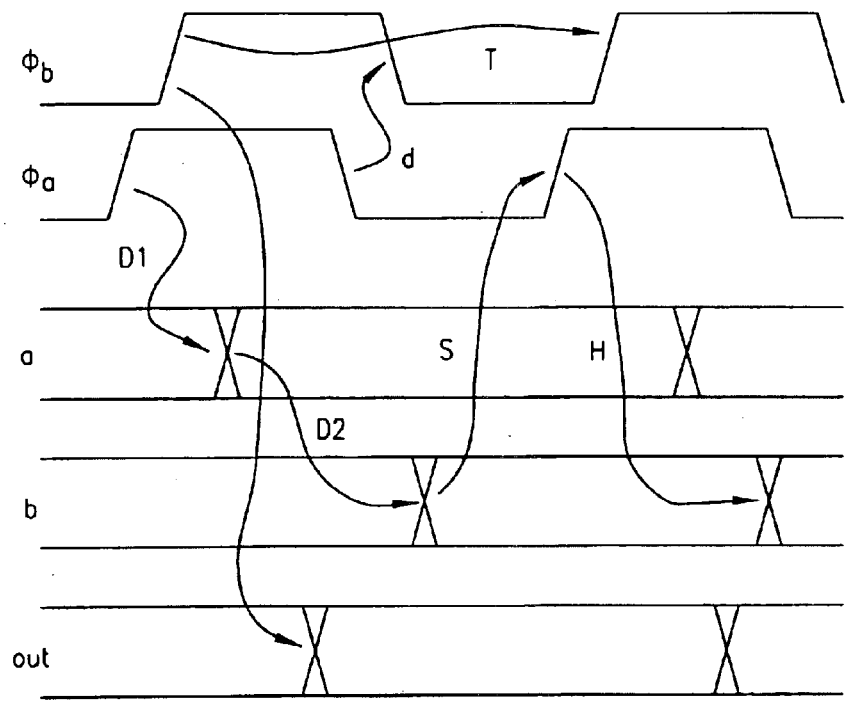
FIG. 7 is a timing diagram illustrating proper setup and hold times associated with the circuit shown in FIG. 6 of the drawings.

With reference now to FIGS. 6 and 7 of the drawings, in order to use the split clock flip-flop 16 of the present invention in a pipeline stage of a digital circuit, the pFETs (M1 and M4 shown in FIG. 5) of the second TSPC flip-flop 16 are controlled by the same clock signal $\Phi_a$ as that used for the previous pipeline stage (TSPC flip-flop 10). Thus, the second TSPC flip-flop 16 has its output Q driven according to the potentially delayed clock $\Phi_b$, which is transmitted over line 12*b* to clock input 18*b*, but its input D latched according to the potentially earlier clock $\Phi_a$, which is transmitted over line 12*a* to clock input 18*a*. It should be noted that the first TSPC flip-flop 10 can also be a split-clock flip-flop, as long as the output Q of the first TSPC flip-flop 10 is controlled by the same clock $\Phi_a$ as the input D of the second TSPC flip-flop 16.

However, any significant skew between the two clocks shown in FIGS. 5–7 has an undesired side effect in the second TSPC flip-flop 16. If there is significant skew, the input clock $\Phi_a$ of the second TSPC flip-flop 16 may fall before the output clock $\Phi_b$ of the second TSPC flip-flop 16, and M6 and M4 will both be on simultaneously for a short interval. If node A is high, short-circuit current will be drawn through M4, M5 and M6.

Figure 8:
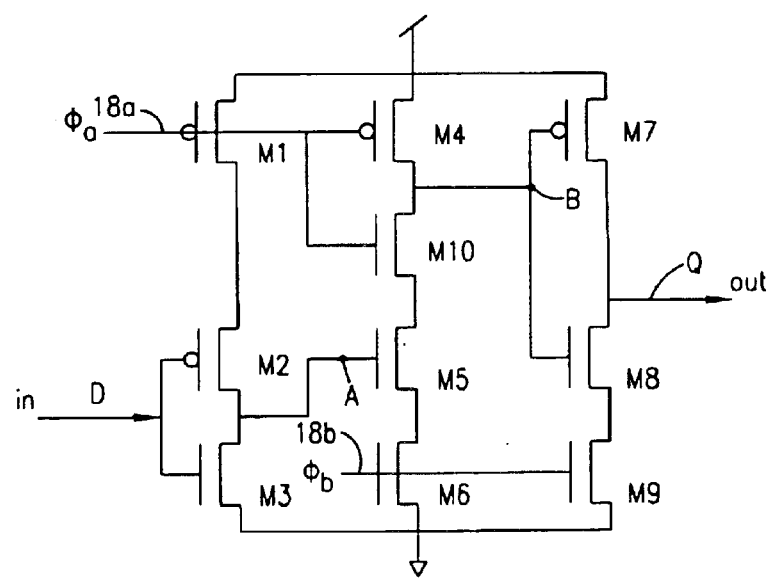
FIG. 8 illustrates a split-clock TSPC flip-flop having an anti-short-circuit-current device in accordance with embodiments of the present invention.
Figure 1:
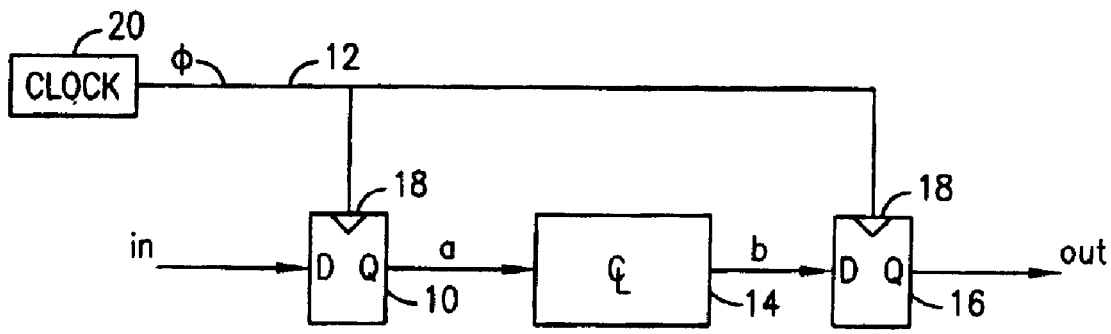
Figure 2:
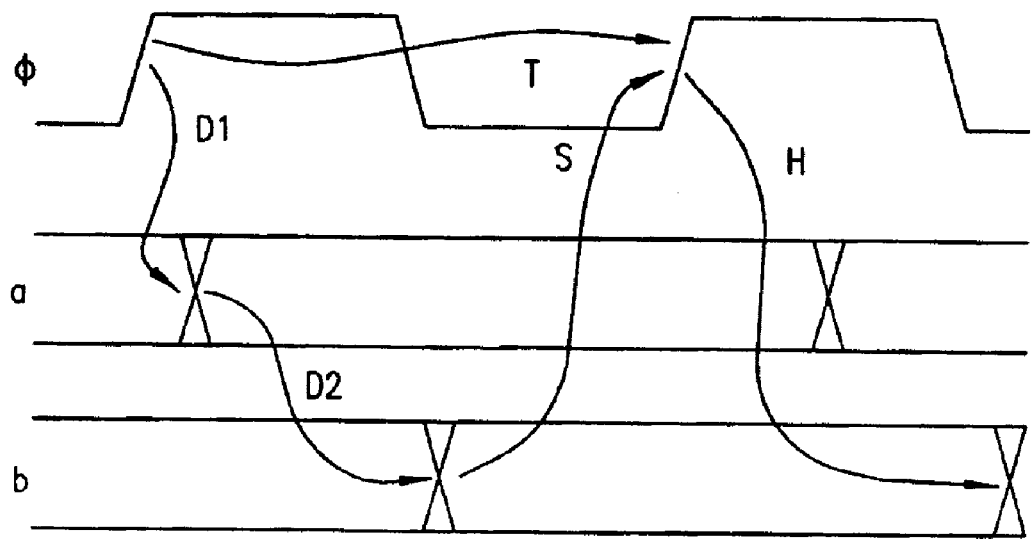
Figure 3:
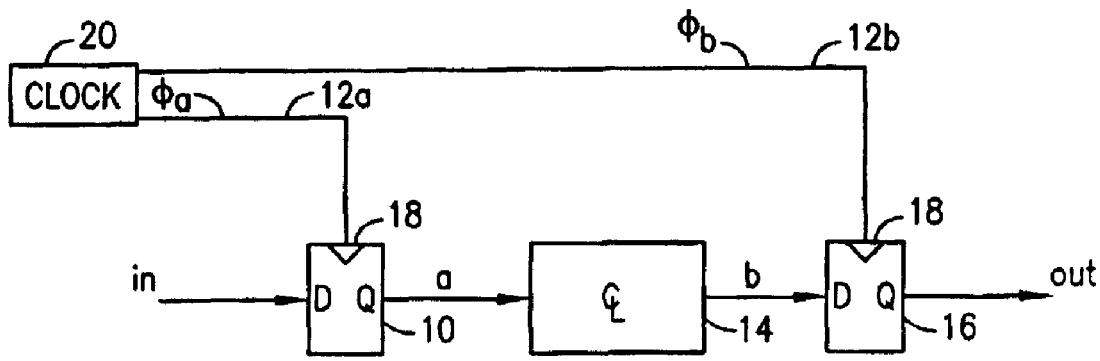
Figure 4:
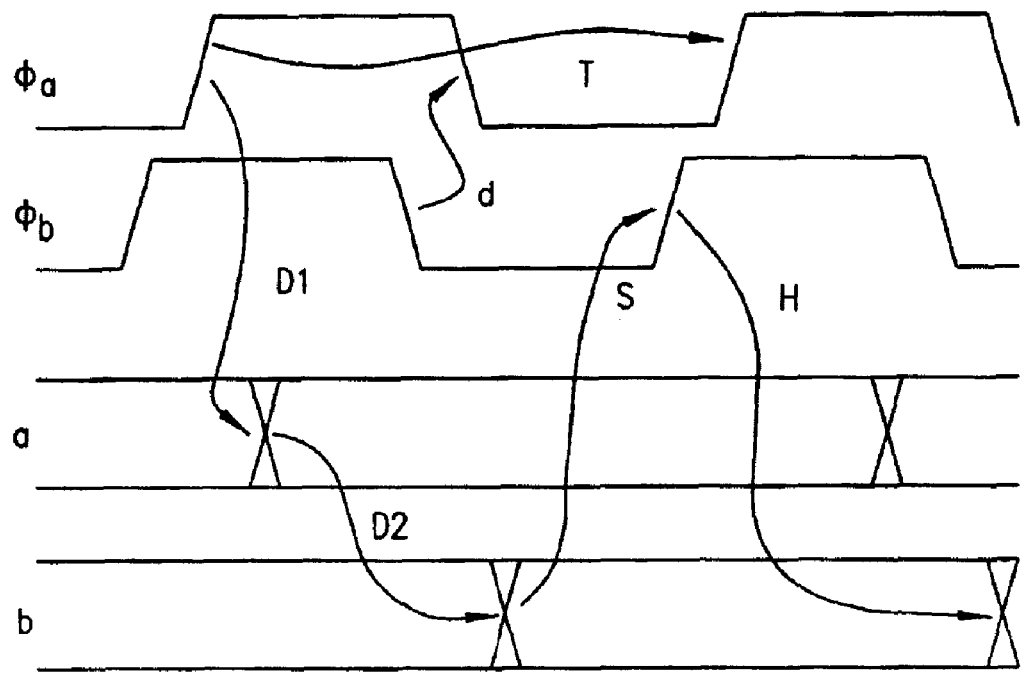

Thus, with reference now to FIG. 8 of the drawings, an additional nFET M10, which is controlled by the input clock $\Phi_a$, can be introduced in series with M4, M5, and M6. The additional nFET M10 serves to turn off the short-circuit path through M4, M5 and M6 when the input clock $\Phi_a$ rises, which reduces the power dissipation in cases of large clock skew. Although the additional nFET M10 is shown between M4 and M5, it should be noted that the best position of the nFET M10 with respect to M4, M5 and M6 depends upon specific detailed circuit parameters. The defining aspect is that the additional nFET m10 is controlled by the input clock $\Phi_a$ and that it serves to turn off the short-circuit path.

Furthermore, it should be noted that the present invention is not limited to the particular type of TSPC flip-flop 16 discussed herein. Instead, the present invention can be applied whenever two classes of clocked devices, which handle the timing on the input side and on the output side of the flip-flop 16, respectively, are identifiable. For example, the input stage of the flip-flop 16 could be controlled by nFETs, while the output stage could be controlled by pFETs.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A flip-flop circuit for reducing the current spike, comprising:
   an input for receiving first data and second data, said first data being received and stored within said flip-flop circuit prior to said input receiving said second data, said first data being isolated from said second data, said input being controlled by a first clock signal;
   an output for transmitting said first data after said input receives said second data, said output being controlled by a second clock signal, said first and second clock signals having the same frequency and substantially the same phase, wherein the arrival time of first and second clock signals at said flip-flop are skewed;
   a first clock input comprising two p-type field effect transistors connected together, wherein the first clock input receives said first clock signal;
   a second clock input comprising two n-type field effect transistors connected together, wherein the second clock input receives said second clock signal, wherein the first one of said two p-type field effect transistors is connected in series with a first one of said two n-type field effect transistors; and
   an additional n-type field effect transistor connected in series with said first p-type field effect transistor and said n-type transistor, said additional n-type effect transistor being controlled by said first clock signal.

2. A sequential logic circuit, comprising:
   a first flip-flop having an input for receiving data and an output for transmitting said data, at least said output of said first flip-flop being controlled by a first clock signal;
   combinational logic connected to said first flip-flop for receiving said data from said first flip-flop; and
   a second flip-flop connected to said combinational logic having an input for receiving said data from said combinational logic and an output for transmitting said data, said input of said second flip-flop being controlled by said first clock signal, said output of said second flip-flop being controlled by a second clock signal, said first and second clock signals having the same frequency and substantially the same phase, wherein the arrival times of said first and second clock signals at said second flip-flop are skewed.

3. The logic circuit of claim 2, wherein said second flip-flop further comprises:
   a first clock input for receiving said first clock signal; and
   a second clock input for receiving said second clock signal.

4. The logic circuit of claim 3, wherein said first clock input comprises two p-type field effect transistors connected together, and said second clock input comprises two n-type field effect transistors connected together.

5. The logic circuit of claim 4, wherein a first one of said two p-type field effect transistors is connected in series with a first one of said two n-type field effect transistors.

6. The logic circuit of claim 5, wherein said second flip-flop further comprises:
   an additional n-type field effect transistor connected in series with said first p-type field effect transistor and said first n-type transistor, said additional n-type field effect transistor being controlled by said first clock signal.

7. A method for reducing current spikes within a logic circuit, comprising the steps of:
- receiving data by a first flip-flop;
- transmitting said data to combinational logic connected to said first flip-flop, said step of transmitting being controlled by a first clock signal;
- receiving said data on an input of a second flip-flop connected to said combinational logic, said step of receiving being controlled by said first clock signal; and
- transmitting said data through an output of said second flip-flop, said step of transmitting being controlled by a second clock signal, said first and second clock signals having the same frequency and substantially the same phase, wherein the arrival times of said first and second clock signals at said second flip-flop are skewed.

8. The method of claim 7, further comprising the steps of:
- receiving at a first clock input of said second flip-flop said first clock signal; and
- receiving at a second clock input of said second flip-flop said second clock signal.

9. The method of claim 8, further comprising the step of:
- reducing short-circuit current in said second flip-flop using an n-type field effect transistor connected in series with said first and second clock inputs, said n-type field effect transistor being controlled by said first clock signal.

* * * * *

UNITED STATES PATENT AND TRADEMARK OFFICE
CERTIFICATE OF CORRECTION

PATENT NO.     : 6,822,495 B2
DATED          : November 23, 2004
INVENTOR(S)    : Alf Larsson and Lars Svensson It is certified that error appears in the above-identified patent and that said Letters Patent is hereby corrected as shown below:

Title page,
Item [74], *Attorney, Agent, or Firm*, please replace "Jenkins" with -- Jenkens --.

Drawings,
Delete Sheets 1 of 4 and 2 of 4 and please replace with attached drawings.

Column 6,
Line 17, please insert an -- s -- at the end of "time".
Line 25, please replace "the" at the beginning of the line with -- a --.

Signed and Sealed this

Eighth Day of November, 2005

JON W. DUDAS
*Director of the United States Patent and Trademark Office*